United States Patent [19]
Mukai

[11] Patent Number: 5,899,710
[45] Date of Patent: May 4, 1999

[54] METHOD FOR FORMING FIELD EFFECT TRANSISTOR HAVING MULTIPLE GATE ELECTRODES SURROUNDING THE CHANNEL REGION

[75] Inventor: Mikio Mukai, Kanagawa, Japan

[73] Assignee: Sony Corporation, Tokyo, Japan

[21] Appl. No.: 09/030,390

[22] Filed: Feb. 25, 1998

Related U.S. Application Data

[62] Division of application No. 08/960,543, Oct. 31, 1997.

[30] Foreign Application Priority Data

Jan. 20, 1995 [JP] Japan ................................ 7-026270

[51] Int. Cl.$^6$ .......................... M01L 21/00; M01L 21/336
[52] U.S. Cl. ............................................ 438/156; 438/268
[58] Field of Search ........................................ 438/156, 268

[56] References Cited

U.S. PATENT DOCUMENTS

| | | |
|---|---|---|
| 4,254,430 | 3/1981 | Beneking . |
| 4,538,165 | 8/1985 | Chang et al. . |
| 4,609,889 | 9/1986 | Kumar . |
| 4,651,180 | 3/1987 | Nishizawa . |
| 4,698,654 | 10/1987 | Kohn . |
| 5,012,305 | 4/1991 | Khadder et al. . |
| 5,084,744 | 1/1992 | Hori et al. . |
| 5,321,289 | 6/1994 | Baba et al. . |
| 5,497,019 | 3/1996 | Mayer et al. . |

*Primary Examiner*—John F. Niebling
*Assistant Examiner*—Michael S. Lebentritt
*Attorney, Agent, or Firm*—Hill & Simpson

[57] ABSTRACT

A field effect transistor comprising source and drain regions, a channel region composed of a semiconductor layer formed between the source and drain regions and gate electrodes disposed to at least three surfaces surrounding the channel region. The structure can increase the number of carriers induced in the channel region and enhance the current driving performance and mutual conductance as compared with the single gate structure or double gate structure.

2 Claims, 12 Drawing Sheets

FIG. IA
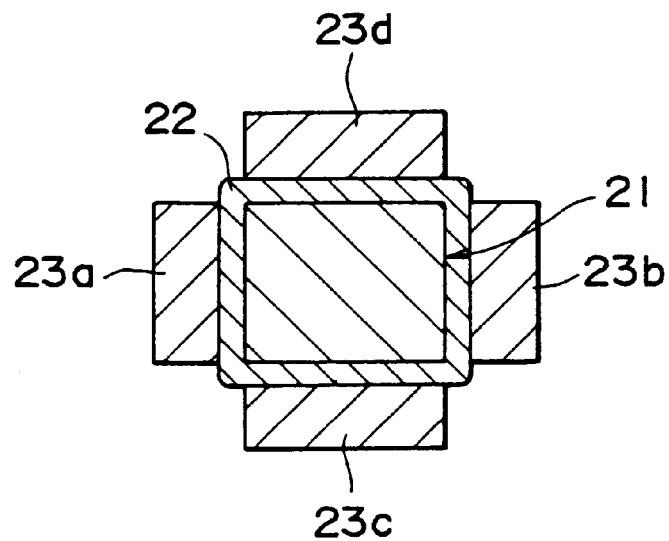
FIG. IB
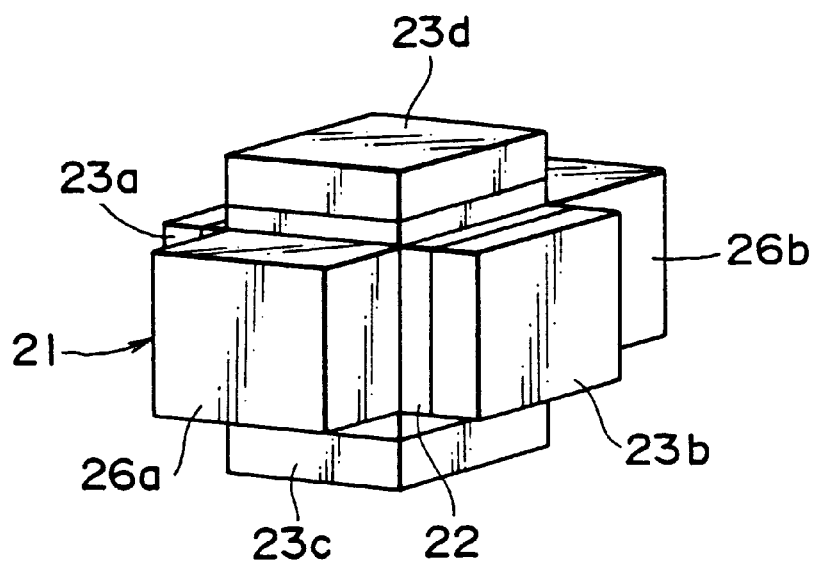

F I G. 4A
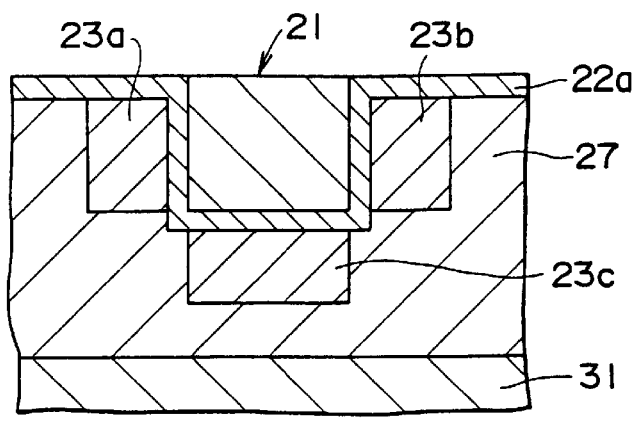
F I G. 4B
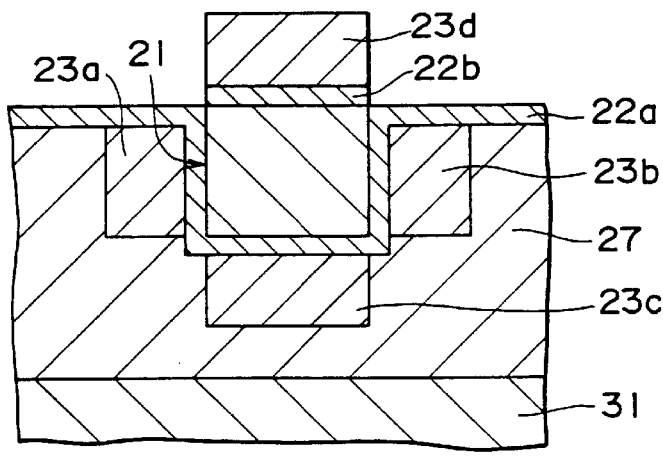
F I G. 5
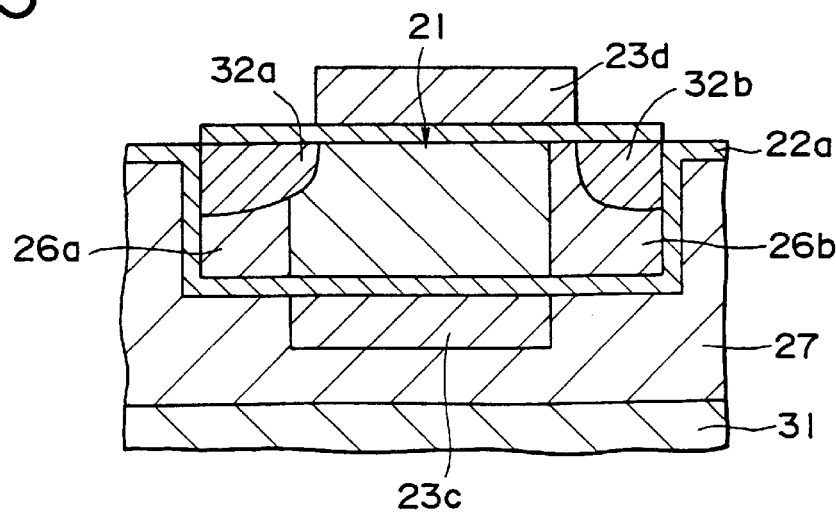

F I G. 12
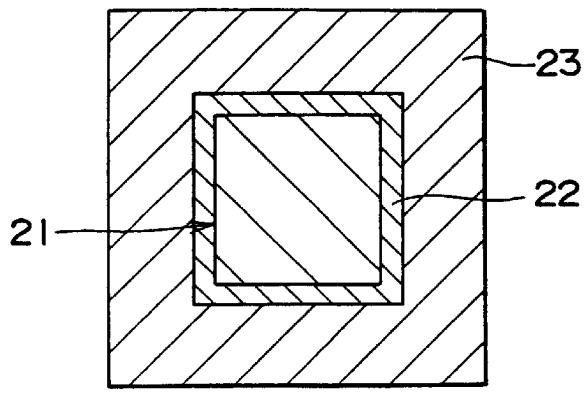
F I G. 13A
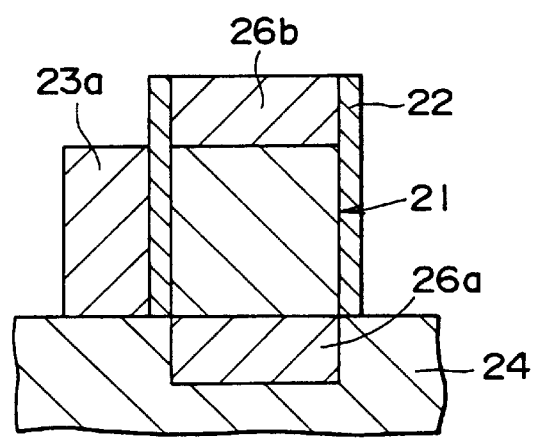
F I G. 13B
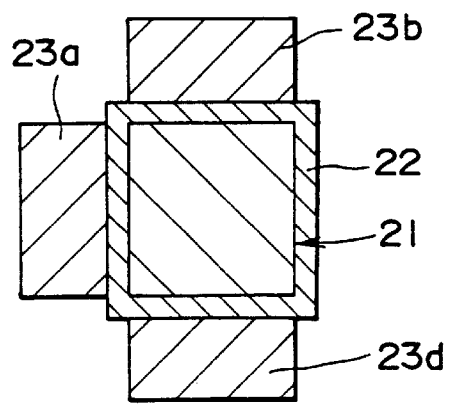

METHOD FOR FORMING FIELD EFFECT TRANSISTOR HAVING MULTIPLE GATE ELECTRODES SURROUNDING THE CHANNEL REGION

This application is a division of 08/960,543 filed Oct. 31, 1997.

BACKGROUND OF THE INVENTION

1. Field of the Invention

The present invention relates to a field effect transistor for controlling the formation of a channel by the application of a voltage to a gate electrode and a method of manufacturing the same.

2. Description of the Related Art

An example of a field effect transistor of a double gate structure in the related art is shown in FIG. 15. In this existent embodiment, n type or p type source/drain regions 13a and 13b are formed on both sides of an n⁻, p⁻, or i type channel region 12 of a semiconductor layer. Gate electrodes 15a and 15b are disposed on both upper and lower surfaces of the channel region 12 by way of gate insulation layers 14a and 14b.

The field effect transistor described above has been manufactured in the related art by epitaxially growing the semiconductor layer 11 on the gate insulation layer 14a by a so-called lateral solid phase epitaxial growth, introduction of an impurity selectively into the semiconductor layer 11 thereby forming the source/drain regions 13a and 13b.

In the field effect transistor of the related art embodiment shown in FIG. 15, since an electric field can be applied from both of the gate electrodes 15a and 15b to the channel region 12, the number of carriers induced in the channel region is greater and the current driving performance and the mutual conductance are higher as compared with a single gate structure.

Further, various characteristics can be attained easily, without introducing impurities into the channel region 12, by operating the gate electrodes 15a and 15b independently of each other and, for example, applying a bias to the channel region 12 on one side of the gate electrodes 15a and 15b.

However, since the power source voltage has been lowered along with miniaturization of the field effect transistor, the current driving performance and the mutual conductance are no more sufficient even in a field effect transistor of the double gate structure in the related art embodiment shown in FIG. 15. Further, since the crystallinity of the semiconductor layer 11 formed on the gate insulation layer 14a by the lateral solid phase epitaxial growth is incomplete, it was difficult to manufacture a field effect transistor having high carrier mobility and high speed operation.

SUMMARY OF THE INVENTION

In the first aspect of the present invention, there is provided a field effect transistor in which gate electrodes are disposed on at least three surfaces surrounding a channel region.

Since a greater number of carriers are induced in the channel region as compared with the single gate structure or double gate structure, the current driving performance and the mutual conductance are high. In addition, since the degree of freedom of wiring configurations is also high, it is advantageous for forming complicated wirings and convenient for miniaturization and high integration degree of integrated circuit devices.

Further, the gate electrodes are made independent of each other and are thereby capable of operating separately. Further, various characteristics can easily be attained without introducing impurities in the channel region.

In a second aspect of the invention, there is provided a method of manufacturing the field effect transistor as described above.

In a method of forming a channel region in a semiconductor substrate, an active region of the field effect transistor can be formed by using a semiconductor substrate having a complete crystallinity and it is possible to form a field effect transistor having high carrier mobility and high speed operation.

Further, according to a method of forming source and drain regions by introducing impurities using a gate electrode as a mask before and after eliminating a semiconductor substrate, since no offset is caused between the gate electrode and the source and drain regions even if the gate electrodes are positionally displaced from each other in a longitudinal direction of the channel, a field effect transistor having high mutual conductance can be manufactured.

Further, according to a method of forming a columnar semiconductor layer on a first impurity layer formed to a semiconductor substrate, an active region of the field effect transistor can be formed with a semiconductor layer of high crystallinity.

BRIEF DESCRIPTION OF THE ACCOMPANYING DRAWINGS

FIGS. 1A and 1B show a first embodiment according to the present invention in which FIG. 1A is a front elevational cross sectional view and FIG. 1B is a perspective view;

FIGS. 4A and 4B are front elevational cross sectional views for the manufacturing steps at the final stage of the first embodiment successively;

FIG. 5 is a side elevational cross sectional shape of the first embodiment;

FIGS. 6A and 6B show a modification of the first embodiment in which FIG. 6A is a front elevational cross sectional view and FIG. 6B is a perspective view;

FIGS. 8A and 8B show a second embodiment according to the present invention in which FIG. 8A is a front elevational cross sectional view and FIG. 8B is a perspective view;

FIG. 12 is a plan view for the modification of the first embodiment;

FIGS. 13A and 13B show another modification of the second embodiment in which FIG. 13A is a front elevational cross sectional view and FIG. 13B is a plan view;

DESCRIPTION OF THE PREFERRED EMBODIMENT

First and second embodiments of the present invention applied to MOS transistor are explained with reference to FIG. 1A to FIG. 14. FIGS. 1A to 7E show the first embodiment and a modification thereof. In the first embodiment, as shown in FIGS. 1A and 1B, an $SiO_2$ film 22 is formed as a gate oxide film to each of upper surface, lower surface and both lateral surfaces of an Si layer 21 as an active layer, and four gate electrodes comprising polycrystal Si films 23a–23d are opposed by way of the $Sio_2$ films 22 to four surfaces of the Si layer 21.

Figure 2A:
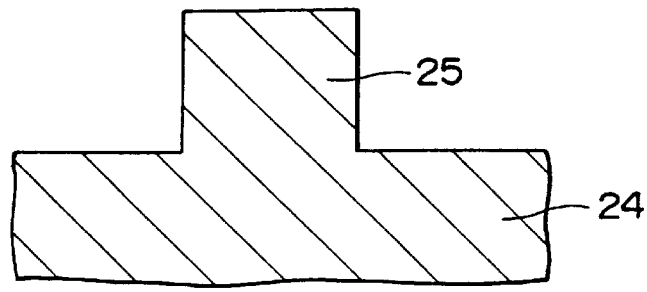
FIGS. 2A to 2C are front elevational cross sectional views for the manufacturing steps at the initial stage of the first embodiment successively.
Figure 2B:
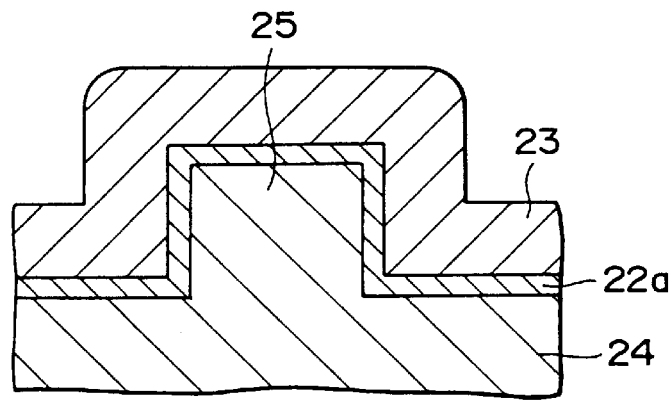

For manufacturing the first embodiment described above, as shown in FIG. 2A, the surface of the Si substrate 24 is at first etched selectively to form a protrusion 25 having a width and a height each of about 0.1 to 0.2 $\mu$m. Then, as shown in FIG. 2B, an $SiO_2$ film 22a of about 5 nm thickness is formed by thermal oxidation or the like on the surface of the Si substrate 24 and then a polycrystal Si film 23 is deposited over the entire surface.

Figure 2C:
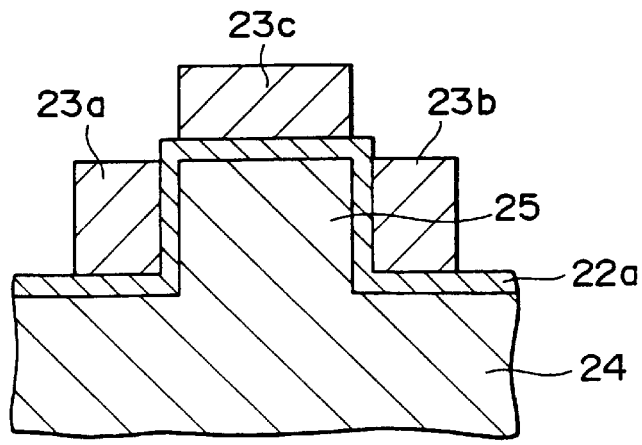

Then, as shown in FIG. 2C, a resist (not illustrated) having the same width as the protrusion 25 is formed on the polycrystal Si film 23 on the protrusion 25, and RIE (reactive ion etching) is applied to the polycrystal Si film 23 using the resist as a mask and a the $SiO_2$ film 22a as a stopper, to form polycrystal Si films 23a–23c as gate electrodes on the upper surface and both lateral surfaces of the protrusion 25.

Then, impurity layers 26a and 26b as source/drain regions are formed in the protrusion 25 by ion implantation of impurities using the resist described above and the polycrystal Si film 23c as a mask, and define a region between the impurity layers 26a and 26b as a channel region.

Figure 3A:
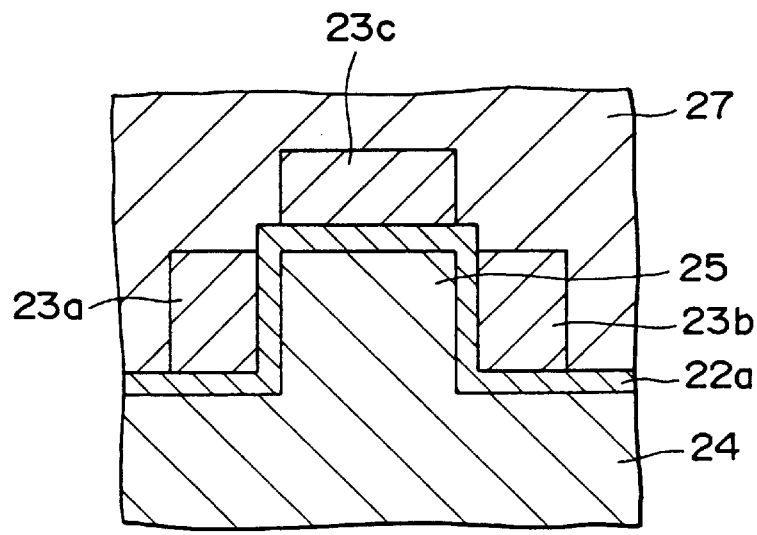
FIGS. 3A and 3B are front elevational cross sectional views for the manufacturing steps at the middle stage of the first embodiment successively.
Figure 3B:
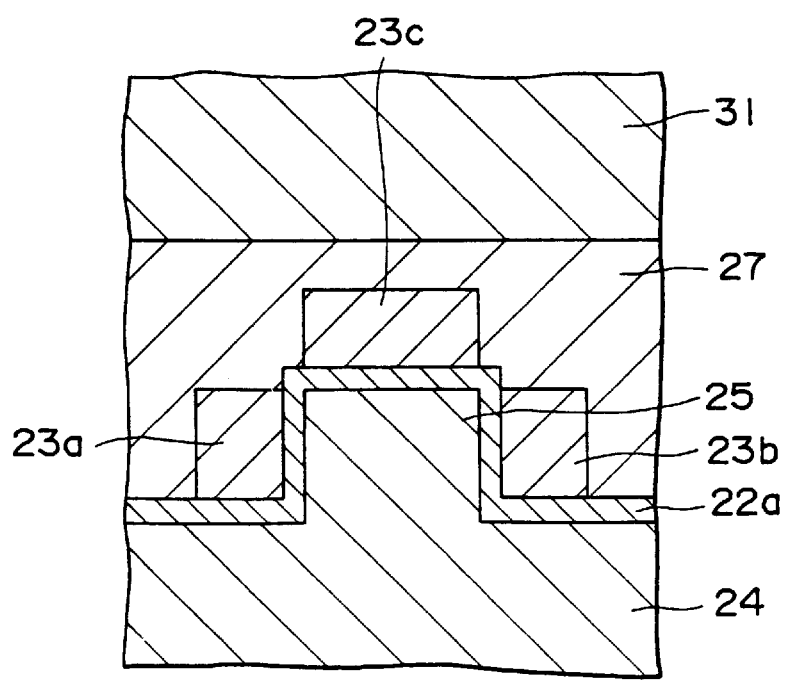
Figure 6A:
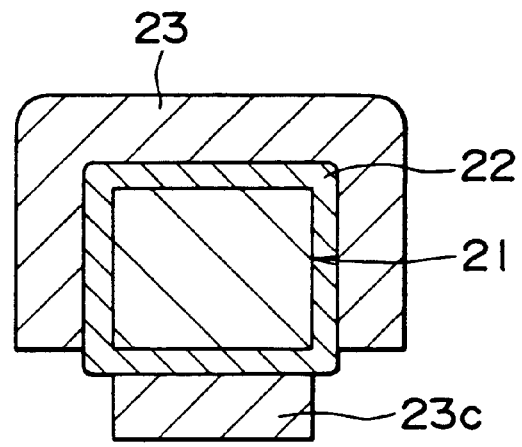
Figure 6B:
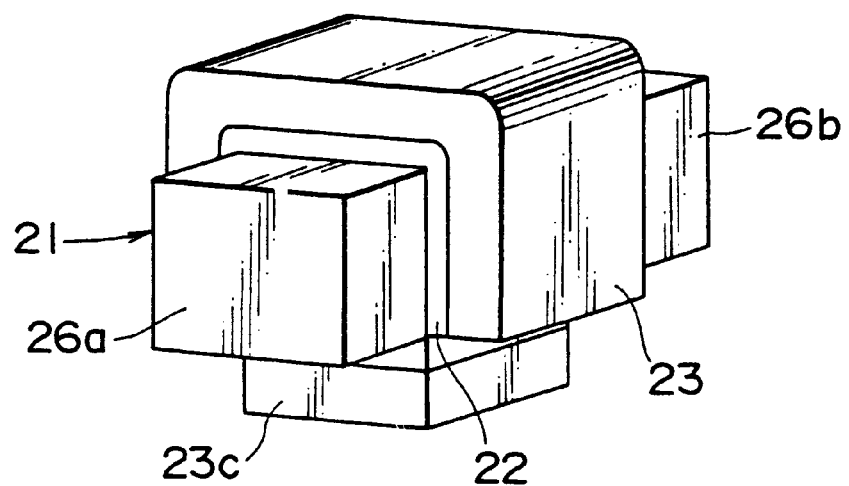

Then, as shown in FIG. 3A, an insulation film such as an $SiO_2$ film 27 is formed, for example, by a CVD process and, as shown in FIG. 3B, the surface of the $SiO_2$ film 27 is planarized, and then another Si substrate 31 is appended to the $SiO_2$ film 27. Then, as shown in FIG. 4A, the Si substrates 24 and 31 are turned upside down, and the Si substrate 24 is polished till the $SiO_2$ film 22a is exposed to leave only the protrusion 25 in the Si substrate 24 as the Si layer 21.

Then, as shown in FIG. 4B, the surface of the Si layer 21 is thermally oxidized to form an $SiO_2$ film 22b, and a polycrystal Si film 23d as a gate electrode is formed on the $SiO_2$ film 22b. Further, a surface protection film (not illustrated) or the like is formed to complete the first embodiment.

In the first embodiment, the impurities are ion injected using the resist and the polycrystal Si film 23c as a mask to form the impurity layers 26a and 26b as the source/drain regions in the step of FIG. 2C. Alternatively, the source/drain regions may be formed by ion injection of impurities using the resist and the polycrystal Si film 23d as a mask in the step of FIG. 4B.

Alternatively, as shown in FIG. 5, after forming the impurity layers 26a and 26b using, for example, the polycrystal Si film 23C as a mask, the impurity layers 32a and 32b are formed again by using, for example, the polycrystal Si film 23d as a mask and both of them are used as the source/drain regions. In this case, as apparent from FIG. 5, even if the polycrystal Si films 23a–23c and the polycrystal Si film 23d are displaced with respect to each other in the direction of the channel length, no offset is caused between the polycrystal Si films 23a–23d and the impurity layers 26a, 26b, 32 and 32b.

In the first embodiment, the polycrystal Si films 23a–23d which are opposed respectively to the four surfaces of the Si layer 21 are separated from each other to form four gate electrodes. Alternatively, the width of the resist may be made greater than that of the protrusion 25 in the step of FIG. 2C thereby leaving the polycrystal Si film 23 opposing the three surfaces of the Si layer 21 as they are and forming two gate electrodes by the polycrystal Si film 23 and the polycrystal Si film 23c. In the case of applying an equal voltage to each of the polycrystal films 23a, 23b and 23d, the structure is more advantageous since the manufacturing the step is simplified.

Further, in the first embodiment, the polycrystal Si films 23a–23d are opposed to the respective four surfaces of the Si layer 21 to form the four gate electrodes. Alternatively, RIE may be applied to the entire surfaces of the polycrystal Si film 23 without using the resist in the step of FIG. 2C, so that the polycrystal Si film 23c is not formed as shown in FIG. 7A.

Figure 7A:
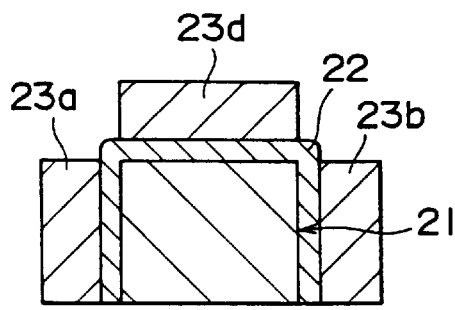
FIGS. 7A to 7E are front elevational cross sectional views illustrating another modification of the first embodiment.
Figure 7D:
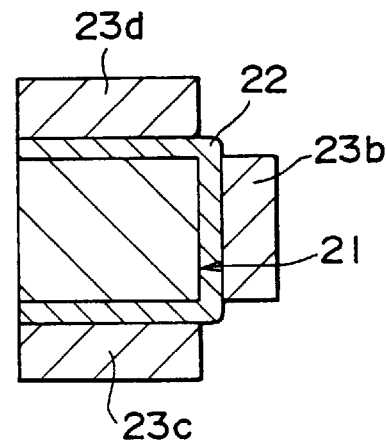
Figure 7B:
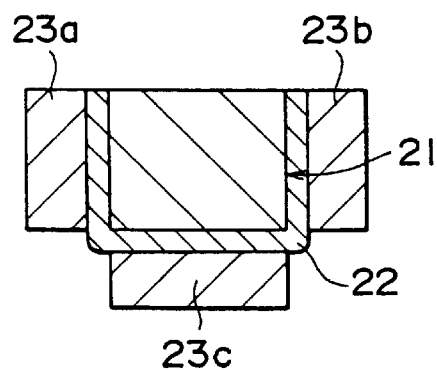

Further, in the modified embodiment shown in FIG. 7A, the polycrystal Si film 23c is not formed. Alternatively, formation of one of the polycrystal Si films 23a–23d may be saved as shown in FIGS. 7B to 7D. Further, as shown in FIG. 7E, the polycrystal Si film 23 opposed to three surfaces of the Si layer 21 may not be separated from each other.

Figure 7E:
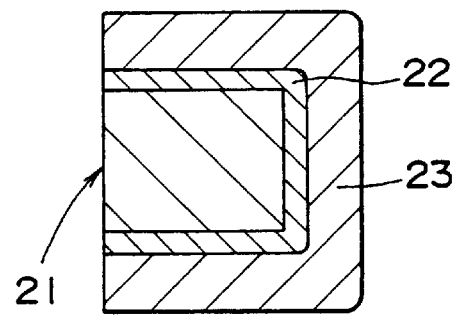
Figure 7C:
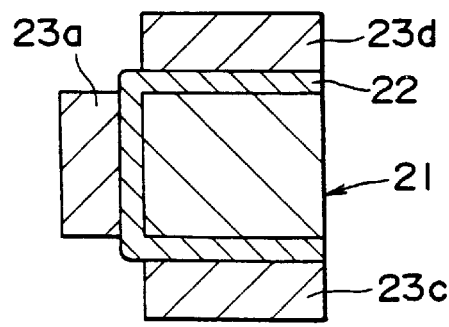

Particularly, the structures shown in FIGS. 7C to 7E are advantageous for the improvement of the integration degree. Further, an integrated circuit device can be constituted by forming a plurality of the first embodiments or the modifications thereof described above and arranging them.

Figure 8A:
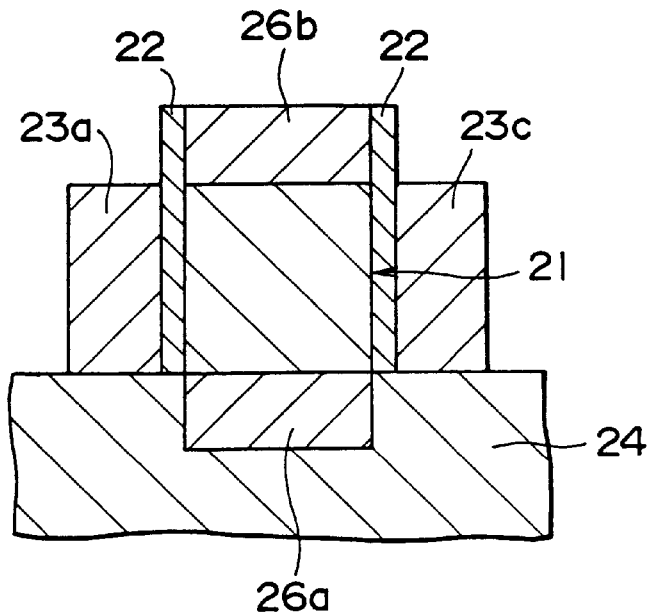
Figure 8B:
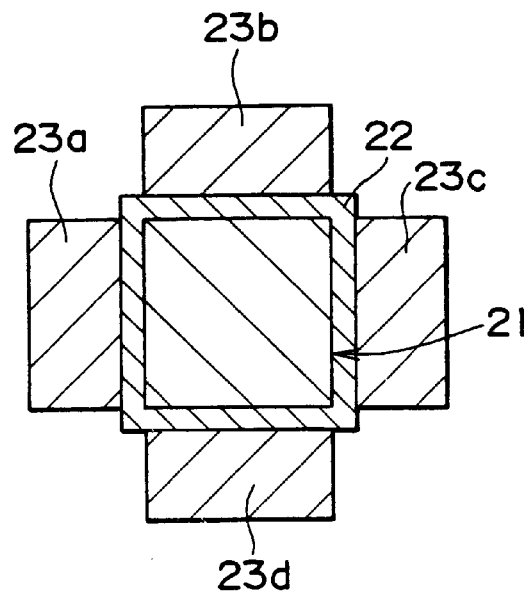

FIG. 8A to FIG. 14 show a second embodiment and modifications therefor. In this second embodiment, as shown in FIGS. 8A and 8B, an impurity layer 26a forming one of source/drain regions is formed in an Si substrate 24, while an impurity layer 26b forming the other of the source/drain regions is formed to the top of the Si layer 21 on the impurity layer 26a.

Then, $SiO_2$ film 22 as the gate oxide film is formed to each of four lateral surfaces of the Si layer 21, and four gate electrodes comprising the polycrystal Si films 23a–23d are opposed respectively to the channel regions between the impurity layer 26a and the impurity layer 26b among four lateral surfaces of the Si layer 21 by way of the $SiO_2$ film 22.

Figure 9A:
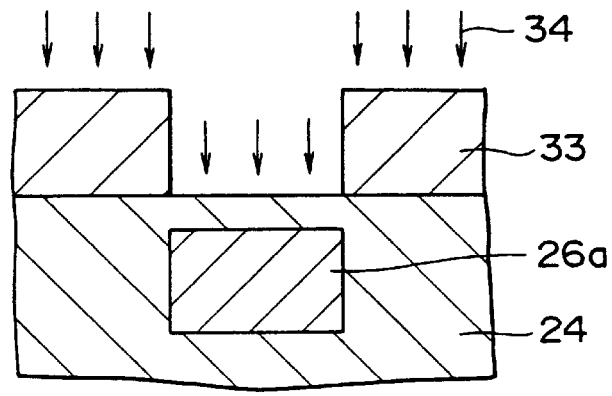
FIGS. 9A to 9C are front elevational cross sectional views for the manufacturing steps at the initial stage of the second embodiment successively.
Figure 9B:
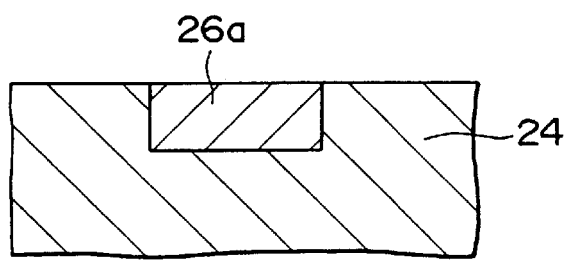

For manufacturing the second embodiment, as shown in FIG. 9A, a resist 33 is at first patterned on the surface of the Si substrate 24 and an impurity 34 is ion injected using the resist 33 as a mask to form an impurity layer 26a buried in the Si substrate 24. Then, as shown in FIG. 9B, the Si substrate 24 is eliminated, for example, by etching or polishing to the midway of the impurity layer 26a. Alternatively, the impurity layer 26a may be formed from the first on the surface of the Si substrate 24.

Figure 9C:
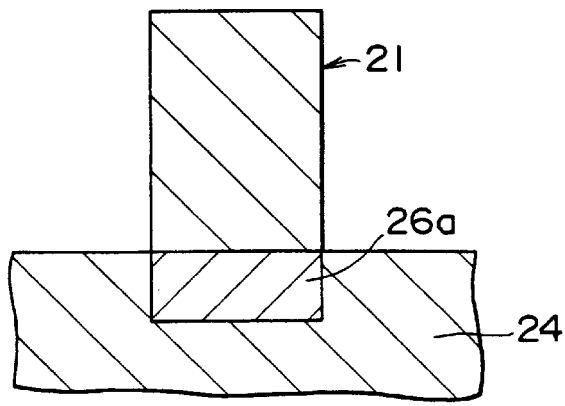

Then, as shown in FIG. 9C, an Si layer 21 is formed on the impurity layer 26a by selectively etching the epitaxial layer grown on the Si substrate 24 or selectively growing an epitaxial layer after forming a mask layer such as the $SiO_2$ film or the resist on the Si substrate 24.

Figure 10A:
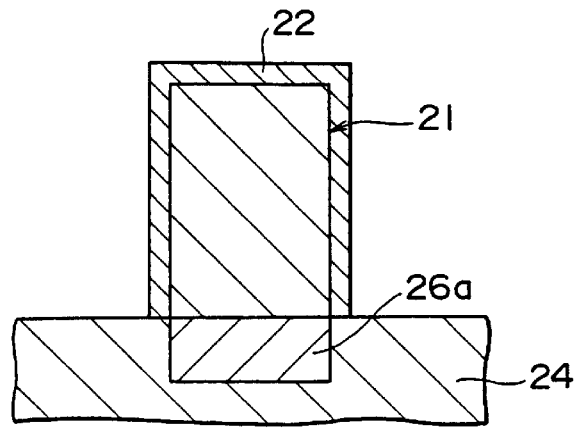
FIGS. 10A and 10B are front elevational cross sectional views for the manufacturing steps at the middle stage of the second embodiment successively.
Figure 10B:
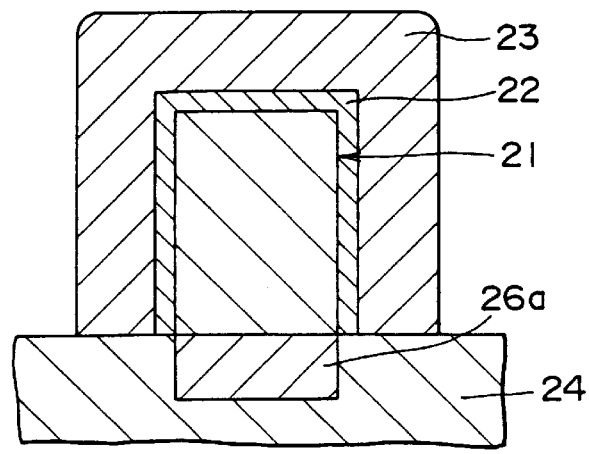

Then, as shown in FIG. 10A, an SiO₂ film 22 having a thickness of about 0.1 to 0.2 μm is formed on the surface of the Si layer 21 and the Si substrate 24 by thermal oxidation and then the SiO₂ film 22 other than the surface of the Si layer 21 is eliminated. Then, as shown in FIG. 10B, the polycrystal Si film 23 deposited on the entire surface is patterned to leave a polycrystal Si film 23 only on the Si layer 21 or at the periphery of the Si layer 21.

Figure 10C:
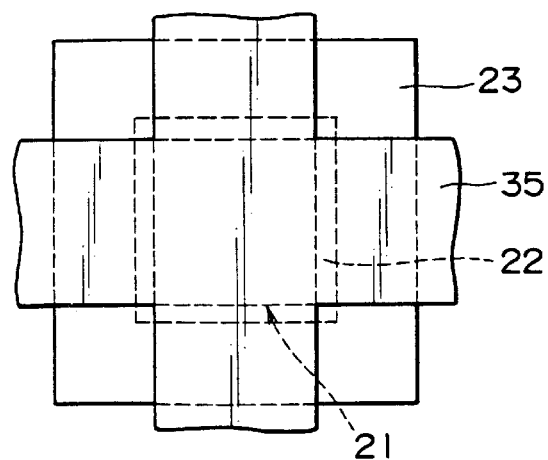
FIG. 10C is a plan view.
Figure 11A:
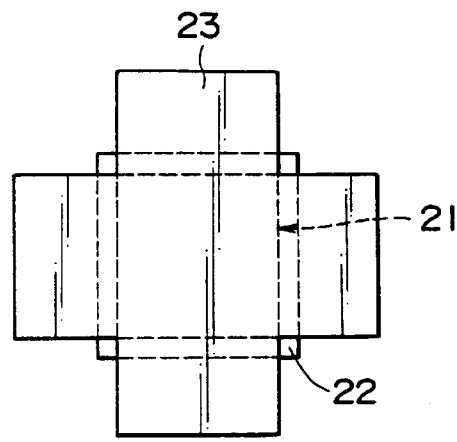
FIG. 11A is a plan view and FIGS. 11B and 11C are front elevational cross sectional view s for the manufacturing steps at the final stage of the second embodiment.

Then, as shown in FIG. 10C, a mask layer 35 of a pattern exposing only the four corners of the polycrystal Si film 23 is formed and RIE is applied to the polycrystal Si film 23 using a mask layer 35 as a mask to separate the polycrystal Si film 23 to portions each opposing to each of four lateral surfaces of the Si layer 21 as shown in FIG. 11A.

Figure 11B:
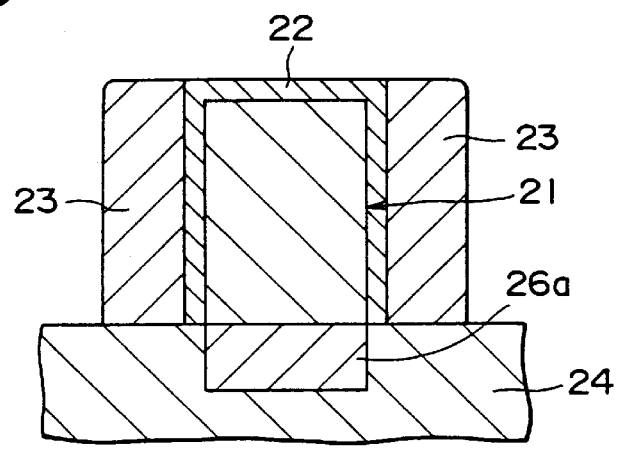
Figure 11C:
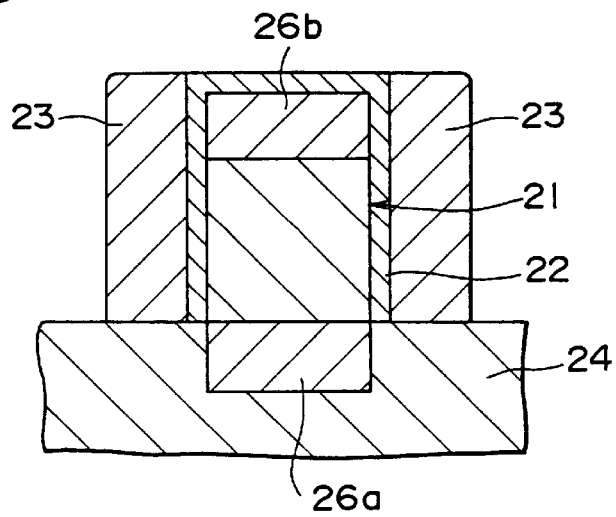

Then, as shown in FIG. 11B, RIE is applied to the polycrystal Si film 23 till the SiO₂ film on the upper surface of the Si layer 21 is exposed, and impurities are injected by ion implantation to the Si layer 21 by using a mask layer (not illustrated) having an opening only above the Si layer 21 to form an impurity layer 26b at the top of the Si layer 21 as shown in FIG. 11C. In this case, the SiO₂ film 22 on the Si layer 21 prevents channeling.

Then, RIE is further applied to the polycrystal Si film 23 and a portion of the polycrystal Si film 23 situating to the lateral side of the impurity layer 26b is removed to form polycrystal Si films 23a–23d as gate electrodes. Then, the SiO₂ film 22 on the Si layer 21 is also removed and, further, a surface protection film (not illustrated) and the like are formed to complete the second embodiment.

In the second embodiment described above, the polycrystal Si films 23a–23d opposed respectively to the four lateral surfaces of the Si layer 21 are separated from each other to constitute four gate electrodes. Alternatively, the steps of FIG. 10C and FIG. 11A may be saved thereby leaving the polycrystal Si film 23 opposing to the four lateral surfaces of the Si layer 21 as they are and forming a single gate electrode by the polycrystal Si film 23 as shown in FIG. 12. In a case of applying an equal voltage to the polycrystal Si films 23a–23d, the structure is more advantageous since the manufacturing the steps are simplified.

Further, in the second embodiment, the polycrystal Si films 23a–23d are opposed to the respective four lateral surfaces of the Si layer 21 to constitute the four gate electrodes. Alternatively, the pattern of the mask layer 35 may be changed such that the polycrystal Si film 23c is not formed as shown in FIGS. 13A and 13B.

Further, in the modification shown in FIGS. 13A and 13B, the polycrystal Si film 23c is not formed. However, formation of one of the polycrystal Si films 23a–23d may be saved. Further, as shown in FIG. 14, the polycrystal Si films 23 opposing to the three lateral surfaces of the Si layer 21 not be separated from each other as shown in FIG. 14.

Figure 14:
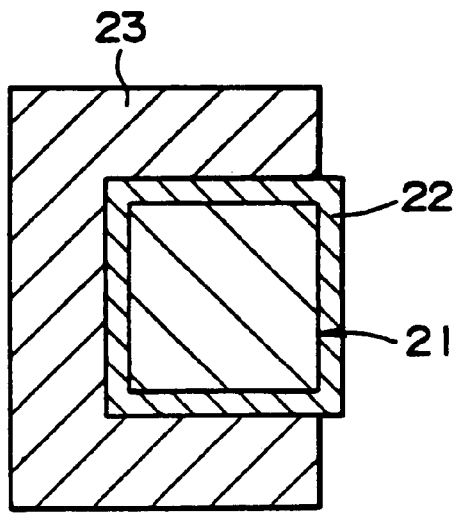
FIG. 14 is a plan view illustrating a further modification of the first embodiment.
Figure 15:
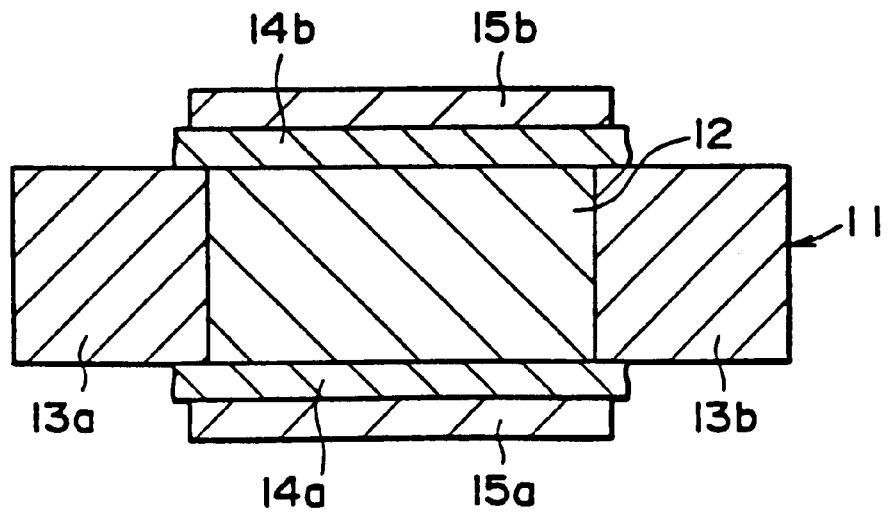
FIG. 15 is a side elevational cross sectional view of an existent embodiment prior to the present invention.

Particularly, the structure shown in FIGS. 13A and 13B or FIG. 14 is advantageous for the improvement of the integration degree. Further, an integrated circuit device can be constituted by forming and arranging a number of the second embodiments or modifications thereof.

What is claimed is:

1. A method of forming a field effect transistor, comprising the steps of:

fabricating a protrusion on a semiconductor substrate;

forming a thin insulation film on the semiconductor substrate having the protrusion formed thereon;

forming a film of an electrode material on said thin insulation film and then forming a gate electrode pattern to at least three surfaces on the side walls of said protrusion by etching;

forming source and drain regions on both ends of said protrusion;

forming an oxide film on said protrusion and said gate electrode and then planarizing said oxide film;

appending another substrate to said planarized oxide film;

removing said semiconductor substrate, thereby exposing said thin insulation film and a surface of the protrusion; and further forming an oxide film and a gate electrode on the surface of the protrusion.

2. A method of forming a field effect transistor, comprising the steps of;

forming a first impurity region in a semiconductor substrate;

removing the surface of said substrate, thereby exposing the surface of said impurity region;

forming a pattern comprising a semiconductor layer on said impurity region, thereby defining a channel region;

forming a thin insulation film on the surface of the pattern of said semiconductor layer;

growing an electrode material layer on said insulation film;

patterning said electrode material layer, thereby forming a gate electrode pattern at the periphery of said semiconductor layer;

etching back said gate electrode pattern until said thin insulation film is exposed;

forming a second impurity region to said channel region on the side opposed to said first impurity region;

forming the first and the second impurity regions as source and drain regions and removing said exposed thin insulation film, thereby exposing the electrode material formed as a channel region; and removing the gate electrode pattern formed to the periphery of said semiconductor layer at a portion in contact with the second impurity layer directly or by way of the thin insulation film.

* * * * *